(12) United States Patent
Jung et al.

(10) Patent No.: US 9,865,701 B2
(45) Date of Patent: Jan. 9, 2018

(54) SCHOTTKY BARRIER DIODE AND METHOD FOR MANUFACTURING THE SAME

(71) Applicant: Hyundai Motor Company, Seoul (KR)

(72) Inventors: Youngkyun Jung, Seoul (KR); Junghee Park, Suwon (KR); Dae Hwan Chun, Gyeonggi-do (KR); JongSeok Lee, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 15/440,657

(22) Filed: Feb. 23, 2017

(65) Prior Publication Data
US 2017/0162665 A1 Jun. 8, 2017

Related U.S. Application Data

(62) Division of application No. 14/952,186, filed on Nov. 25, 2015, now abandoned.

(30) Foreign Application Priority Data

Jul. 27, 2015 (KR) .................. 10-2015-0106106

(51) Int. Cl.
*H01L 29/66* (2006.01)
*H01L 29/16* (2006.01)
*H01L 21/02* (2006.01)
*H01L 29/872* (2006.01)
*H01L 23/535* (2006.01)
*H01L 21/768* (2006.01)
*H01L 21/265* (2006.01)
*H01L 21/306* (2006.01)

(52) U.S. Cl.
CPC .. *H01L 29/66143* (2013.01); *H01L 21/02529* (2013.01); *H01L 21/26506* (2013.01); *H01L 21/30604* (2013.01); *H01L 21/76895* (2013.01); *H01L 23/535* (2013.01); *H01L 29/1608* (2013.01); *H01L 29/872* (2013.01)

(58) Field of Classification Search
CPC ............... H01L 29/872; H01L 29/0602; H01L 29/1508; H01L 29/6606
See application file for complete search history.

(56) References Cited

U.S. PATENT DOCUMENTS

2005/0029615 A1 2/2005 Tanaka et al.
2016/0133736 A1* 5/2016 Morin ................. H01L 29/7722
257/77

FOREIGN PATENT DOCUMENTS

JP 2000101101 4/2000
JP 2000-294804 A 10/2000
(Continued)

*Primary Examiner* — Matthew Reames
(74) *Attorney, Agent, or Firm* — Mintz Levin Cohn Ferris Glovsky and Popeo, P.C.; Peter F. Corless

(57) ABSTRACT

A Schottky barrier diode includes: an n+ type of silicon carbide substrate; an n− type of epitaxial layer formed on a first surface of the n+ type of silicon carbide substrate; a plurality of p+ regions formed inside the n− type of epitaxial layer; a Schottky electrode formed in an upper portion of the n− type of epitaxial layer of an electrode region; and an ohmic electrode formed on a second surface of the n+ type of silicon carbide substrate, wherein the plurality of p+ regions are formed to be spaced apart from each other at a predetermined interval within the n− type of epitaxial layer.

8 Claims, 6 Drawing Sheets

(56) References Cited

FOREIGN PATENT DOCUMENTS

| | | | |
|---|---|---|---|
| JP | 2002-314099 | A | 10/2002 |
| JP | 2010-225878 | A | 10/2010 |
| JP | 2012-169386 | A | 9/2012 |
| JP | 2015-162572 | A | 9/2015 |
| KR | 2014-0079027 | A | 6/2014 |

* cited by examiner

SCHOTTKY BARRIER DIODE AND METHOD FOR MANUFACTURING THE SAME

CROSS-REFERENCE TO RELATED APPLICATION

This application is a Divisional Application of U.S. patent application No. 14/952,186, filed Nov. 25, 2015, which claims priority to and the benefit of Korean Patent Application No. 10-2015-0106106 filed in the Korean Intellectual Property Office on Jul. 27, 2015, wherein the entire contents of which are incorporated herein by reference.

BACKGROUND OF THE DISCLOSURE (a) Technical Field

The present disclosure relates generally to a Schottky barrier diode and a method for manufacturing the same, and more particularly, to a Schottky barrier diode and a method for manufacturing the same capable of reducing on-resistance.

(b) Description of the Related Art

Generally, a semiconductor light-emitting device includes a semiconductor device capable of generating various colors of light due to recombination of electrons and holes at a junction portion of n-type of and p-type of semiconductors when it is applied with a current. The semiconductor light-emitting device has several merits over a filament-based light-emitting device, such as longer life, lower power, excellent initial driving characteristics, and higher vibration resistance, and therefore, demand for the semiconductor light-emitting device has continuously increased.

Further, with the recent development of information communication technologies around the world, communication technologies for super-high speed, large-capacity signal transmission has become increasingly important. In particular, wireless communication technologies, which is utilized in myriad devices, such as a personal mobile phone, satellite communication, military radar, broadcasting communication, a relay for communication, and the like, have been gradually expanded. Similarly, the demand for a high-speed, high-power electronic device required for a super-high speed information and communication system of a microwave band and a millimeter wave band has increased.

Further, research has been conducted to reduce an energetic loss when the semiconductor light-emitting device is implemented in a high-power device. Except for silicon (Si)-based power devices, which is a common type of power device, silicon carbide (SiC) devices having a large band gap have also been widely produced as a Schottky barrier diode (SBD) structure.

The Schottky barrier diode uses a Schottky junction in which a metal and a semiconductor make a junction with each other without using the PN junction, unlike a general PN diode, and has fast switching characteristics and turn-on voltage characteristics lower than the PN diode. The general Schottky barrier diode may cut off a leak current due to the overlapping of PN diode depletion layers diffused at the time of application of a reverse voltage and improve a breakdown voltage, by applying a structure of a junction barrier Schottky (JBS), in which a P+ region is formed, to a lower portion of a Schottky junction part to improve the reduction characteristics in the leak current.

However, the conventional Schottky barrier diode suffers from a problem in that a contact area of a Schottky electrode with an n-epitaxial layer or an n-drift layer, which is a forward current path, is narrow due to a presence of the P+ region in the Schottky junction part to increase a resistance value and increase on-resistance of the Schottky barrier diode.

The above information disclosed in this Background section is only for enhancement of understanding of the background of the disclosure, and therefore, it may contain information that does not form the related art that is already known in this country to a person of ordinary skill in the art.

SUMMARY OF THE DISCLOSURE

The present disclosure has been made in an effort to provide a Schottky barrier diode and a method for manufacturing the same capable of expanding a contact area of a Schottky electrode with an n− type of epitaxial layer, by forming a junction barrier Schottky (JBS) region by injecting p+ ions into the n− type of epitaxial layer and then growing high-concentration n− type of epitaxial layer using epitaxial growth.

Embodiments of the present disclosure provide a Schottky barrier diode, including: an n+ type of silicon carbide substrate; an n− type of epitaxial layer formed on a first surface of the n+ type of silicon carbide substrate; a plurality of p+ regions formed inside the n− type of epitaxial layer; a Schottky electrode formed in an upper portion of the n− type of epitaxial layer of an electrode region; and an ohmic electrode formed on a second surface of the n+ type of silicon carbide substrate. The plurality of p+ regions are formed to be spaced apart from each other at a predetermined interval within the n− type of epitaxial layer.

The plurality of p+ regions may each be formed with the same width.

Furthermore, according to embodiments of the present disclosure, a method for manufacturing a Schottky barrier diode includes: forming an n− type of epitaxial layer on a first surface of an n+ type of silicon carbide substrate; patterning a plurality of trenches to be spaced apart from each other at a predetermined interval in an upper surface of the n− type of epitaxial layer; forming a first blocking part within the plurality of trenches; forming a plurality of second blocking parts to be spaced apart from each other at a predetermined interval in an upper portion of the n− type of epitaxial layer; forming a p+ region by injecting p+ ions into the n− type of epitaxial layer using the first blocking part and the plurality of second blocking parts as a mask; removing the first blocking part and the plurality of second blocking parts; growing the n− type of epitaxial layer to enclose the p+ region; forming a Schottky electrode in an upper portion of the grown n− type of epitaxial layer; and forming an ohmic electrode on a second surface of the n+ type of silicon carbide substrate.

Each of the plurality of trenches may be patterned so that a depth of each trench is shorter than a height of the n− type of epitaxial layer, The plurality of second blocking parts may contact at least two first blocking parts.

A side of one of the plurality of second blocking parts may be connected to a side of the first blocking part.

The first blocking part and the plurality of second blocking parts may be made of the same material.

The first blocking part and the plurality of second blocking parts may be configured of an oxide layer.

The removing of the first blocking part and the plurality of second blocking parts may be performed by a wet etch method or a dry etch method.

The growing of the n− type of epitaxial layer to enclose the p+ region may include: growing the n− type of epitaxial layer within the plurality of trenches; and growing the n− type of epitaxial layer in an upper portion of the grown n− type of epitaxial layer and the p+ region.

Furthermore, according to embodiments of the present disclosure, a Schottky barrier diode includes: an n+ type of silicon carbide substrate; an n− type of epitaxial layer formed on a first surface of the n+ type of silicon carbide substrate; a plurality of p+ regions formed inside the n− type of epitaxial layer; a Schottky electrode formed in an upper portion of the n− type of epitaxial layer; and an ohmic electrode formed on a second surface of the n+ type of silicon carbide substrate. The n− type of epitaxial layer and the plurality of p+ regions may be manufactured by any one of the methods for manufacturing a Schottky barrier diode as described above.

Accordingly, it is possible to expand the contact area of the Schottky electrode with the n− type of epitaxial layer, by forming the junction barrier Schottky (JBS) region by injecting the p+ ions into the n− type of epitaxial layer and then growing the high-concentration n− type of epitaxial layer using the epitaxial growth. Furthermore, it is possible to reduce the on-resistance due to the increase in the Schottky contact area and the presence of the high-concentration region at the time of the application of the forward voltage while maintaining the JBS effect as it is at the time of the application of the reverse voltage.

The effects which may be obtained or predicted by the embodiments of the present disclosure will be directly or implicitly disclosed in the detailed description of the embodiments of the present disclosure. That is, various effects which are predicted by the embodiments of the present disclosure will be disclosed in the detailed description to be described below.

DETAILED DESCRIPTION OF THE EMBODIMENTS

Hereinafter, embodiments of the present disclosure will be described with reference to the accompanying drawings. However, the following illustrated drawings and the detailed description to be described below relate to certain embodiments among several embodiments for effectively describing features of the present disclosure. Therefore, the present disclosure is not limited to only the following drawings and the description.

Further, in describing below embodiments of the present disclosure, well-known functions or constructions will not be described in detail since they may unnecessarily obscure the understanding of the present disclosure. Further, the following terminologies are defined in consideration of the functions in the present disclosure and may be construed in different ways by the intention of users, operators, practices, or the like. Therefore, the definitions thereof should be construed based on the contents throughout the specification.

Further, for efficiently describing the technical core features of the present disclosure, terms will be appropriately changed, integrated, or separately used in the following embodiments to be clearly understood by those skilled in the art, but the present disclosure is not limited thereto.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Hereinafter, a Schottky barrier diode according to embodiments of the present disclosure will be described with reference to FIG. 1.

Figure 1:
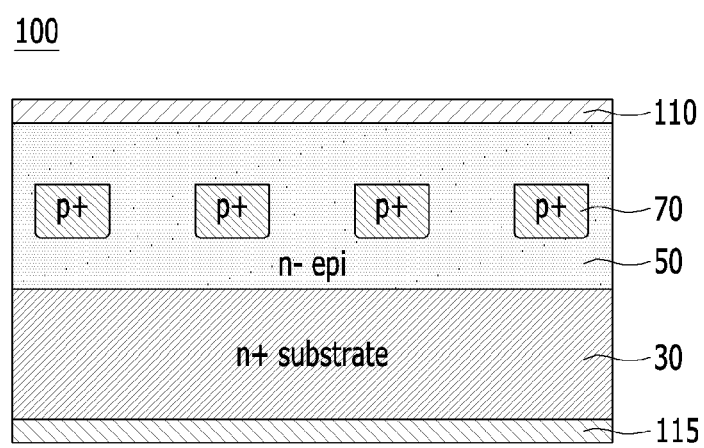
FIG. 1 is a cross-sectional view of a Schottky barrier diode according to embodiments of the present disclosure.

FIG. 1 is a cross-sectional view of a Schottky barrier diode according to embodiments of the present disclosure.

As shown in FIG. 1, a Schottky barrier diode 100 according to embodiments of the present disclosure is configured to include an n+ type of silicon carbide substrate 30, an n− type of epitaxial layer 50, a plurality of p+ regions 70, a Schottky electrode 110, and an ohmic electrode 115.

In the Schottky barrier diode 100, the n− type of epitaxial layer 50 is disposed on one surface (i.e., a first surface) of the n+ type of silicon carbide substrate 30 and the Schottky electrode 110 is disposed in an upper portion of the n− type of epitaxial layer 50. Further, the ohmic electrode 115 is disposed on the other surface (i.e., a second surface) of the n+ type of silicon carbide substrate 30.

The plurality of p+ regions 70 are formed inside the n− type of epitaxial layer 50. The plurality of p+ regions 70 may be formed to be spaced apart from each other at a predetermined interval within the n− type of epitaxial layer 50, and each may be formed to have the same width.

In the Schottky barrier diode 100, the case in which the p+ region 70 is formed at the same width is described as an example, but embodiments of the present disclosure is not limited thereto. Therefore, the width of the p+ region 70 may be changed as needed.

Further, a longitudinal cross-section of the p+ region 70 may be formed in any one of a circle, an oval, and a polygon shape. For example, the longitudinal cross-section of the p+ region 70 may be formed in a quadrangle shape as illustrated in FIG. 1.

Therefore, the Schottky barrier diode 100 according to embodiments of the present disclosure may greatly reduce on-resistance at the time of a device operation due to presence of a high-concentration n+ region 30 and an increase in a Schottky junction area while maintaining a junction barrier Schottky (JBS) effect by the p+ region 70. As a result, the Schottky barrier diode 100 according to embodiments of the present disclosure may improve a current density to reduce an area of the device and improve a device yield per unit wafer to save costs of the device.

A method for manufacturing a Schottky barrier diode 100 according to embodiments of the present disclosure configured as described above will be described with reference to FIGS. 2 to 6.

FIGS. 2 to 6 are diagrams sequentially illustrating a method for manufacturing a Schottky barrier diode according to embodiments of the present disclosure.

Figure 2:
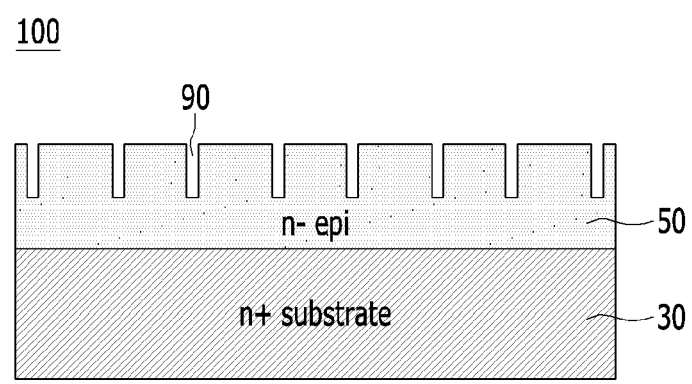
FIGS. 2 to 6 are diagrams sequentially illustrating a method for manufacturing a Schottky barrier diode according to embodiments of the present disclosure.

As shown in FIG. 2, the n– type of epitaxial layer 50 is formed on one surface (i.e., a first surface) of the n+ type of silicon carbide substrate 30.

In other words, to form the Schottky barrier diode 100, the n+ type of silicon carbide substrate 30 is prepared.

Next, the n– type of epitaxial layer 50 is formed on one surface of the n+ type of silicon carbide substrate 30 by epitaxial growth.

Subsequently, a plurality of trenches 90 are patterned in a portion of an upper surface of the n– type of epitaxial layer 50. The trenches 90 are formed to be spaced apart from each other at a predetermined interval on the upper surface of the n– type of epitaxial layer 50, and a depth of the trench 90 may be formed to be shorter than a height of the n-type of epitaxial layer 50. That is, the trenches 90 are formed by patterning while being spaced apart from each other at a predetermined interval at a portion of the upper surface of the n– type of epitaxial layer 50.

Figure 3:
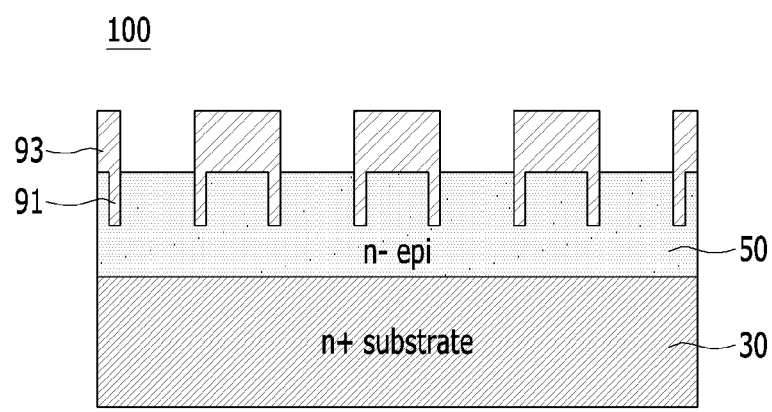

As shown in FIG. 3, a first blocking part 91 is formed in the trench 90 is formed. The first blocking part 91 serves to determine a form of the p+ region 70 when the p+ region 70 to be described below is formed.

Further, the first blocking part 91 prevents the p+ ions from being diffused at the time of the injection of the p+ ions to form the p+ region 70, and may be differently formed depending on a size and a shape of the p+ region 70.

Next, second blocking parts 93 are formed on the first blocking part 91 and the n-type of epitaxial layer 50. The second blocking parts 93 are formed to be spaced apart from each other at a predetermined interval on the upper surface of the n-type of epitaxial layer 50, and may be formed between at least two first blocking parts 91. That is, the second blocking parts 93 may be formed between the first blocking parts 91 on the upper surface of the n– type of epitaxial layer 50 and are formed to be spaced apart from each other at a predetermined interval to form the p+ region 70 by injecting the p+ ions. For the purposes of the present disclosure, the second blocking parts 93 may include a single second blocking part or a plurality of second blocking parts.

The second blocking part 93 configured as described above contacts at least two first blocking parts 91 at the lower portion to form masks connected to each other. The first blocking part 91 and the second blocking part 93 may be made of the same material, in which the same material may be an oxide layer which is a hard oxide mask.

Figure 4:
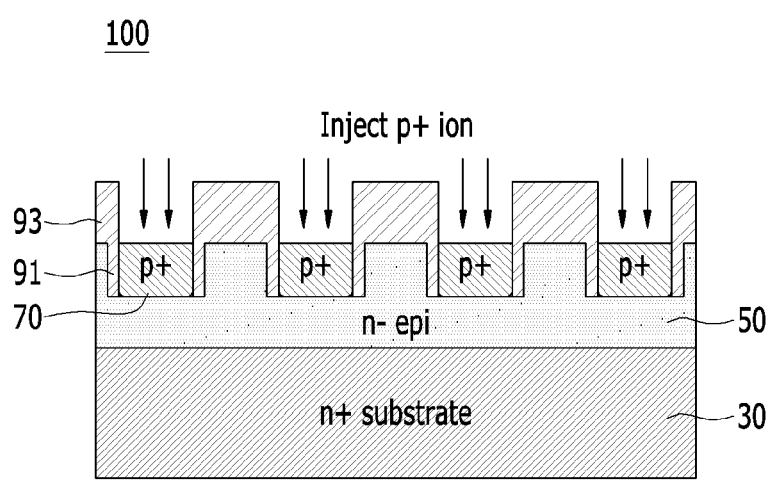

As shown in FIG. 4, the p+ region 70 is formed by injecting the p+ ions into the n– epitaxial layer 50 using the mask configured of the first blocking part 91 and the second blocking part 93 as a blocking layer.

The p+ region 70 may be formed in a region of less than the depth of the first blocking part 91, and may also be formed to be deeper than the first blocking part 91. The p+ region 70 may inject the p+ ions only into the desired position using the mask configured of the first blocking part 91 and the second blocking part 93 as the blocking layer, such that the p+ region 70 may be formed at the desired size and position.

Figure 5:
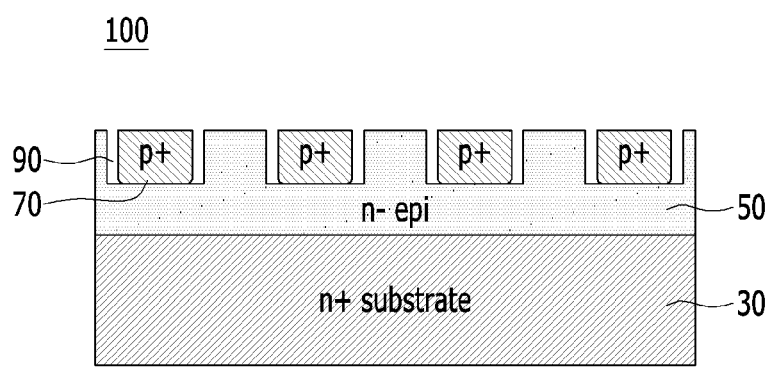

As shown in FIG. 5, the first blocking part 91 and the second blocking part 93 are removed.

A predetermined space is formed between the p+ region 70 and the n– type of epitaxial layer 50 by removing the first blocking part 91 formed in the n– type of epitaxial layer 50.

Figure 6:
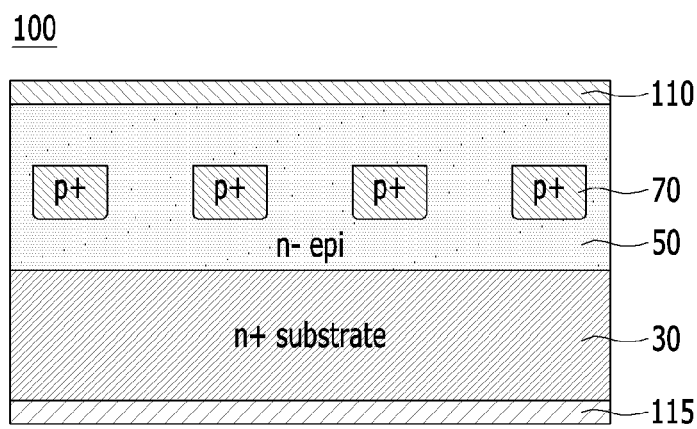

As shown in FIG. 6, the n– type of epitaxial layer 50 is grown to enclose the p+ region 70 by performing a crystalline re-growth process on the n– type of epitaxial layer 50.

That is, FIG. 6 illustrates re-growing the n– type of epitaxial layer 50 so that a predetermined space formed between the p+ region 70 and the n– type of epitaxial layer 50 within the trench 90 is filled. At the same time, the n– type of epitaxial layer 50 is grown so that it may also be formed on the p+ region 70. Therefore, the p+ regions 70 may be formed at a position where they are spaced apart from each other at a predetermined interval within the n– type of epitaxial layer 50. Next, the Schottky electrode 110 is formed in the upper portion of the n– type of epitaxial layer 50 and the ohmic electrode 115 is formed on the other surface (i.e., a second surface) of the n+ type of silicon carbide substrate 30.

As a result, the Schottky barrier diode 100 according to embodiments of the present disclosure manufactured by the above-mentioned method may reduce the on-resistance due to the increase in the Schottky contact area and the presence of the high-concentration region at the time of application of the forward voltage while maintaining the JBS effect as it is at the time of application of the reverse voltage. Further, the Schottky barrier diode 100 according to embodiments of the present disclosure may further increase current characteristics by performing the process as the desired line width without diffusing the p+ ions at the time of the p+ ion injection process due to the first blocking part 91 and the second blocking part 93.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

DESCRIPTION OF SYMBOLS

100 . . . Schottky barrier diode
30 . . . n+ type of silicon carbide substrate
50 . . . n– type of epitaxial layer
70 . . . p+ region
90 . . . Trench
91 . . . First blocking part
93 . . . Second blocking part
110 . . . Schottky electrode
115 . . . Ohmic electrode

What is claimed is:

1. A method for manufacturing a Schottky barrier diode, comprising:
   forming an n– type of epitaxial layer on a first surface of an n+ type of silicon carbide substrate;
   patterning a plurality of trenches to be spaced apart from each other at a predetermined interval in an upper surface of the n– type of epitaxial layer;
   forming a first blocking part within the plurality of trenches;
   forming a plurality of second blocking parts to be spaced apart from each other at a predetermined interval in an upper portion of the n– type of epitaxial layer;
   forming a p+ region by injecting p+ ions into the n– type of epitaxial layer using the first blocking part and the plurality of second blocking parts as a mask;
   removing the first blocking part and the plurality of second blocking parts;
   growing the n– type of epitaxial layer to enclose the p+ region;
   forming a Schottky electrode in an upper portion of the grown n– type of epitaxial layer; and forming an ohmic electrode on a second surface of the n+ type of silicon carbide substrate.

2. The method of claim 1, wherein each of the plurality of trenches is patterned so that a depth of each trench is shorter than a height of the n– type of epitaxial layer.

3. The method of claim 1, wherein the plurality of second blocking parts contacts at least two first blocking parts.

4. The method of claim 3, wherein a side of one of the plurality of second blocking parts is connected to a side of the first blocking part.

5. The method of claim 1, wherein the first blocking part and the plurality of second blocking parts are made of the same material.

6. The method of claim 5, wherein the first blocking part and the plurality of second blocking parts are configured of an oxide layer.

7. The method of claim 1, wherein the removing of the first blocking part and the plurality of second blocking parts is performed by a wet etch method or a dry etch method.

8. The method of claim 1, wherein the growing of the n– type of epitaxial layer to enclose the p+ region comprises:
   growing the n– type of epitaxial layer within the plurality of trenches; and
   growing the n– type of epitaxial layer in an upper portion of the grown n– type of epitaxial layer and the p+ region.

* * * * *